US011323140B2

(12) United States Patent
Ono et al.

(10) Patent No.: US 11,323,140 B2
(45) Date of Patent: May 3, 2022

(54) SIGNAL GENERATION APPARATUS AND SIGNAL GENERATION METHOD

(71) Applicant: ANRITSU CORPORATION, Kanagawa (JP)

(72) Inventors: Hirofumi Ono, Kanagawa (JP); Ryo Inomata, Kanagawa (JP); Kenji Goto, Kanagawa (JP); Mayfor Dangkiw, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 0 days.

(21) Appl. No.: 17/155,714

(22) Filed: Jan. 22, 2021

(65) Prior Publication Data

US 2021/0234560 A1 Jul. 29, 2021

(30) Foreign Application Priority Data

Jan. 27, 2020 (JP) ............................ JP2020-010772
Mar. 16, 2020 (JP) ............................ JP2020-044949

(51) Int. Cl.
*H04K 1/02* (2006.01)
*H04B 1/00* (2006.01)
*H04B 17/11* (2015.01)
*H03M 1/10* (2006.01)
*H03M 1/86* (2006.01)

(52) U.S. Cl.
CPC ........ *H04B 1/0028* (2013.01); *H03M 1/1071* (2013.01); *H03M 1/86* (2013.01); *H04B 17/11* (2015.01)

(58) Field of Classification Search
CPC ...... H04B 1/0028; H04B 17/11; H04B 17/14; H04B 17/0085; H03M 1/1071; H03M 1/86
USPC ................................. 375/224, 297; 455/130
See application file for complete search history.

(56) References Cited

U.S. PATENT DOCUMENTS

2005/0277391 A1* 12/2005 Miyatani ............... H03F 1/0205 455/127.1
2008/0144707 A1* 6/2008 Tsfati ..................... H04B 17/13 375/224
2008/0197925 A1* 8/2008 Furuta .................. H04B 1/0475 330/149
2011/0263213 A1* 10/2011 Harel ........................ H03F 3/24 455/73
2013/0034139 A1* 2/2013 Khlat ........................ H03F 3/24 375/224

(Continued)

FOREIGN PATENT DOCUMENTS

JP 2019-129333 A 8/2019

*Primary Examiner* — Don N Vo
(74) *Attorney, Agent, or Firm* — Pearne & Gordon LLP

(57) ABSTRACT

An object of the present disclosure is to prevent an output level of an analog signal from exceeding a predetermined upper limit value, in a module that adjusts a level of the analog signal. According to the present disclosure, there is provided a signal generation apparatus including an RF base module (12) that converts a digital base band signal for testing into an intermediate frequency (IF) signal and outputs the IF signal, and a control unit (18), in which the RF base module is connected to an RF converter (20) which outputs an analog RF signal obtained by frequency-converting the IF signal, and the control unit clips the IF signal output from the RF base module based on an output level of the analog RF signal output from the RF converter.

9 Claims, 5 Drawing Sheets

(56) References Cited

U.S. PATENT DOCUMENTS

2015/0145599 A1* 5/2015 Liou .................... H03F 1/0222
330/291

* cited by examiner

Reference table

| X (Sg output level) [Dbm] | Upper limit value of Γ (crest factor) | Clipping amount [Db] |
|---|---|---|
| $+4 < X \leqq +5$ | $\Gamma \leq 10$ | 6 |
| $+3 < X \leqq +4$ | $\Gamma \leq 11$ | 5 |
| $+2 < X \leqq +3$ | $\Gamma \leq 12$ | 4 |
| $+1 < X \leqq +2$ | $\Gamma \leq 13$ | 3 |
| $0 < X \leqq +1$ | $\Gamma \leq 14$ | 2 |
| $-1 < X \leqq 0$ | $\Gamma \leq 15$ | 1 |
| $\leqq -1$ | $\Gamma \leq 16$ | No clipping |

FIG. 4

SIGNAL GENERATION APPARATUS AND SIGNAL GENERATION METHOD

TECHNICAL FIELD

The present disclosure relates to a signal generation apparatus and a signal generation method for generating a test signal.

BACKGROUND ART

A signal generation apparatus for generating a test signal for testing a mobile communication device is proposed (see, for example, Patent Document 1). The signal generation apparatus of Patent Document 1 modulates an analog signal for testing, amplifies the modulated analog signal, adjusts a level of the amplified analog signal, and outputs an analog radio frequency (RF) signal for testing from an antenna.

RELATED ART DOCUMENT

Patent Document

[Patent Document 1] JP-A-2019-129333

DISCLOSURE OF THE INVENTION

Problem that the Invention is to Solve

In a module which amplifies and adjusts the level of the analog signal, an output level of the analog signal fluctuates depending on an inside of the module or a state of the signal input to the module. In a case where the amplified analog signal exceeds an upper limit value of the output level, a failure may occur in the module which adjusts the level of the analog signal.

An object of the present disclosure is to prevent an output level of an analog signal from exceeding a predetermined upper limit value, in a module that adjusts a level of the analog signal.

Means for Solving the Problem

According to the present disclosure, there is provided a signal generation apparatus including: an RF converter (20) that converts an analog signal for testing into an analog RF signal; and a control unit (18 and 31) that controls an input level of the analog signal to prevent the output level from exceeding a predetermined upper limit value.

In the signal generation apparatus according to the present disclosure, the RF converter includes a power amplifier (21) that amplifies the analog signal, and a switch (24 and 25) that switches between a first path (22) passing through the power amplifier and a second path (23) bypassing the power amplifier, and the control unit controls the switch.

The signal generation apparatus according to the present disclosure, further includes a frequency calibration execution unit (33) that adjusts an amplitude of a frequency included in the analog RF signal; and a temperature sensor (27) that measures a temperature inside the RF converter, in which the control unit connects the switch to the first path with completion of the adjustment by the frequency calibration execution unit as a trigger, and switches the switch from the first path to the second path based on a temperature fluctuation detected by the temperature sensor.

The signal generation apparatus according to the present disclosure, further includes the RF converter s connected to a signal source (10) that generates the analog signal for testing by using an RF cable (30), and includes a cable sensor (28) that detects disconnection of the RF cable, and when the cable sensor detects the disconnection of the RF cable, the control unit switches the switch from the first path to the second path.

The signal generation apparatus according to the present disclosure, further includes an activation sensor (17) that detects activation of the signal source is provided, and when the activation sensor detects the activation of the signal source, the control unit connects the switch to the second path.

The signal generation apparatus according to the present disclosure, further includes an RF base module (12) that converts a digital base band signal for testing into an intermediate frequency (IF) signal and outputs the IF signal, in which the RF base module is connected to the RF converter (20) to which the IF signal is input and which outputs an analog RF signal obtained by frequency-converting the IF signal, and the control unit clips the IF signal output from the RF base module based on an output level of the analog RF signal output from the RF converter.

The signal generation apparatus according to the present disclosure, further includes a reference table that determines a clipping amount according to the output level of the analog RF signal, in which when the output level of the analog RF signal is set, the control unit calculates a threshold value of clipping power based on the reference table, and in a case where the power of the digital base band signal exceeds the threshold value, the RF base module performs clipping in the clipping amount determined in the reference table.

The signal generation apparatus according to the present disclosure, further includes a base band module (11) that generates the digital base band signal and outputs the digital base band signal to the RF base module; and the RF converter (20).

The signal generation apparatus according to the present disclosure, further includes the RF converter includes a power amplifier (21), and a switch (24 and 25) that switches between a path passing through the power amplifier and a path bypassing the power amplifier.

According to the present disclosure, there is provided a signal generation method using a signal generation apparatus including an RF converter (20) that converts an analog signal for testing into an analog RF signal, the method including: a control step of controlling an output level of the analog signal to prevent the output level from exceeding a predetermined upper limit value.

In the signal generation method according to the present disclosure, the RF converter includes a power amplifier (21) that amplifies the analog signal, and a switch (24 and 25) that switches between a first path (22) passing through the power amplifier and a second path (23) bypassing the power amplifier, and in the control step, based on at least one of a temperature fluctuations in the RF converter, disconnection of an RF cable (30) that inputs the analog signal for testing to the RF converter, and activation of a signal source (10) that generates the analog signal for testing, the switch is controlled to be switched from the first path to the second path.

In the signal generation method according to the present disclosure, the signal generation apparatus includes an RF base module (12) that converts a digital base band signal for testing into an intermediate frequency (IF) signal and outputs the IF signal, and a control unit (18), the RF base module is connected to an RF converter (20) to which the IF signal is input and which outputs an analog RF signal obtained by frequency-converting the IF signal, and in the control step, the IF signal output from the RF base module is controlled to be clipped based on an output level of the analog RF signal output from the RF converter. [Advantage of the Invention]

According to the present disclosure, in a module that adjusts a level of an analog signal, it is possible to prevent an output level of the analog signal from exceeding a predetermined upper limit value.

BRIEF DESCRIPTION OF THE DRAWINGS

FIG. 4 illustrates an example of a reference table.

BEST MODE FOR CARRYING OUT THE INVENTION

Figure 1:
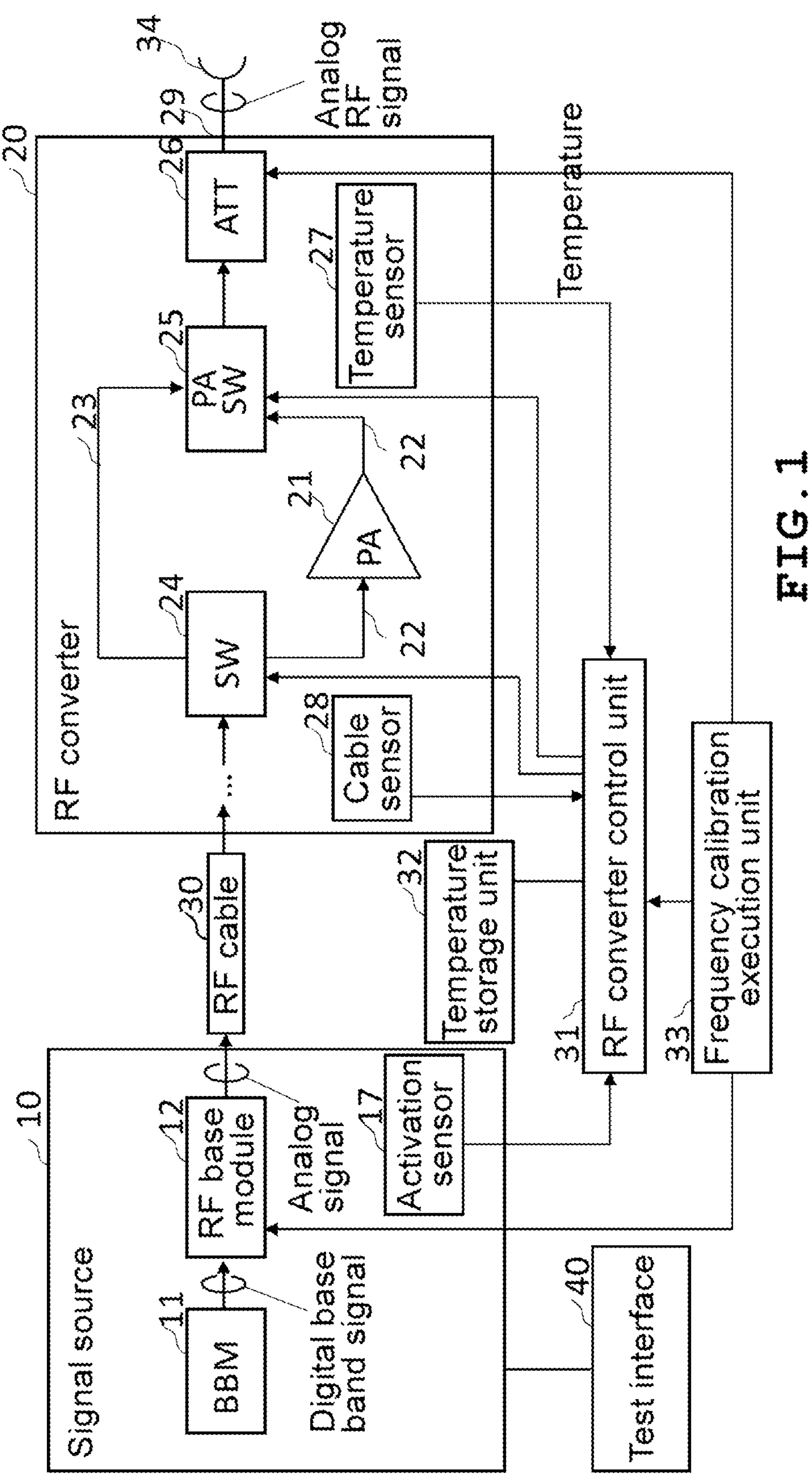
FIG. 1 illustrates an example of a system configuration according to a first embodiment.

Hereinafter, embodiments according to the present disclosure will be described in detail with reference to drawings. The present disclosure is not limited to the embodiments described below. These embodiments are merely examples, and the present disclosure can be implemented in various modifications and improvements based on the knowledge of those skilled in the art. In this specification and the drawings, configuration elements having the same reference numerals indicate the same elements.

FIG. 1 illustrates an example of a system configuration according to a first embodiment. A system according to the first embodiment includes a configuration for generating an analog RF signal for testing. Specifically, the system according to the first embodiment includes a signal source 10 which generates an analog signal having an intermediate frequency bandwidth, a radio frequency (RF) converter 20 which modulates the analog signal having the intermediate frequency bandwidth to generate an analog RF signal, and a test interface 40 which sets the analog RF signal to be generated by the RF converter 20. As an example, a frequency of the analog signal having the intermediate frequency bandwidth is 4.5 GHz, and a frequency of the analog RF signal is 24.25 GHz to 29.5 GHz.

The signal source 10 and the RF converter 20 are connected by an interchangeable RF cable 30. The test interface 40 is connected only to the signal source 10. The test interface 40 sets an analog RF signal to be generated, and the signal source and the RF converter 20 generate the analog RF signal according to the setting. The generated analog RF signal is output by an output terminal 29 provided in the RF converter 20. An output cable is connected to the output terminal 29. The analog RF signal can be wirelessly transmitted from an antenna 34 provided on the output cable.

The system according to the present embodiment includes a configuration for adjusting an output level of the analog RF signal at an output end of the RF converter 20. Specifically, the system according to the present embodiment includes an RF converter control unit 31, a temperature storage unit 32, and a frequency calibration execution unit 33. The RF converter control unit 31 and the frequency calibration execution unit 33 are connected to the signal source 10 and the RF converter 20.

A signal generation apparatus according to the present disclosure includes the RF converter 20, the RF converter control unit 31, and the temperature storage unit 32. The signal generation apparatus according to the present disclosure may include the signal source 10 and the frequency calibration execution unit 33 in addition to the RF converter 20, the RF converter control unit 31, and the temperature storage unit 32. The apparatus according to the present disclosure can also be realized by a computer and a program, and the program can be recorded on a recording medium or provided through a network.

The signal source 10 includes a base band module (BBM) 11 which outputs a digital base band signal, and a radio frequency (RF) base module 12 which outputs an analog signal having an intermediate frequency bandwidth. The BBM 11 generates a test signal having any pattern. The RF base module 12 includes a digital to analog converter (DAC) which converts a digital signal into an analog signal, and converts a digital signal from the BBM 11 into an analog signal having an intermediate frequency bandwidth. The signal source 10 according to the present embodiment further includes an activation sensor 17 which detects ON and OFF of a power supply of the signal source 10.

The RF converter 20 includes a power amplifier (hereinafter, referred to as a power amplifier (PA)) which amplifies an analog signal, and an attenuator (ATT) 26 which adjusts an amplitude of the analog signal. The RF converter 20 according to the present embodiment further includes a temperature sensor 27 which measures a temperature inside the RF converter 20, and a cable sensor 28 which detects connection or disconnection of the RF cable 30.

The frequency calibration execution unit 33 adjusts an amplitude of an intermediate frequency bandwidth analog signal (an IF signal) so that an amplitude of a center frequency of each subcarrier becomes a desired value. For example, the frequency calibration execution unit 33 controls the DAC provided in the RF base module 12 so that a peak value of the amplitude of the analog signal having the intermediate frequency bandwidth output from the RF base module 12 becomes a desired value. Further, the frequency calibration execution unit 33 controls the ATT 26 so that a peak value of an amplitude of an analog signal output from a switch (hereinafter, referred to as a PASW) 25 connected to an output side of the PA 21 becomes a desired value.

The RF converter 20 according to the present embodiment includes a path 22 which passes through a PA 21 and a path 23 which bypasses the PA 21. The path 22 and the path 23 can be switched by using a switch (hereinafter, referred to as an SW) 24 connected to an input side of the PA 21 and the PASW 25.

In a case where an output level of the analog signal amplified by the PA 21 exceeds an absolute maximum rating predetermined for the RF converter 20, it becomes an excessive input state in which an excessive load is applied to the PASW 25. Therefore, the present disclosure prevents the excessive input state by switching between the path 22 and the path 23.

Figure 2:
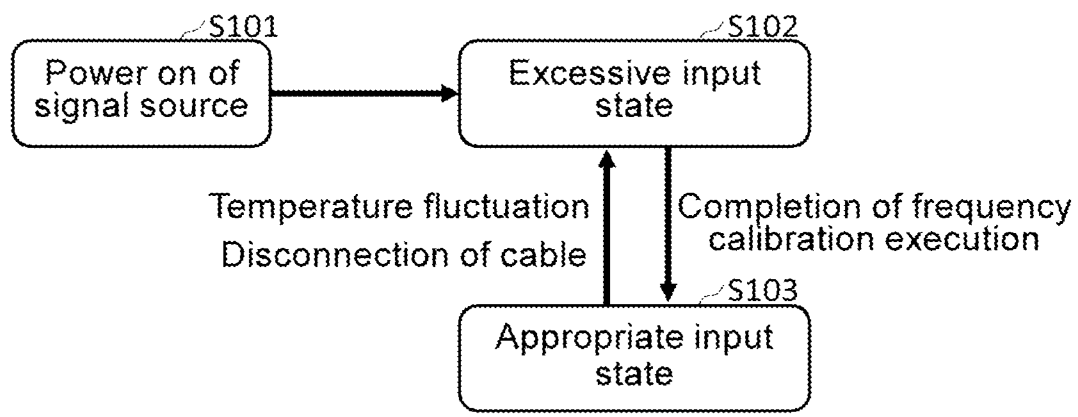
FIG. 2 illustrates an example of a state transition diagram of an RF converter according to the embodiment.

FIG. 2 illustrates an example of a state transition diagram of an SG signal output according to the embodiment. The present embodiment has two states of an excessive input state S102 and an appropriate input state S103. The excessive input state S102 is a state in which an excessive load may be applied to the PASW 25. The appropriate input state S103 is a state in which an appropriate current flows into the PASW 25.

When the signal source 10 is activated (S101), the activation sensor 17 notifies the RF converter control unit 31 that the signal source 10 is activated. The RF converter control unit 31 uses this notification as a trigger to connect the SW 24 and the PASW 25 to the path 23. In this manner, in the present disclosure, the state unconditionally transitions to the excessive input state S102.

The frequency calibration execution unit 33 executes frequency calibration when the SW 24 and PASW 25 are connected to the path 23 after the signal source 10 is activated, as a trigger. When the execution of the frequency calibration is completed, the frequency calibration execution unit 33 notifies the RF converter control unit 31 that the execution of the frequency calibration is completed. The RF converter control unit 31 uses this notification as a trigger to connect the SW 24 and the PASW 25 to the path 22. Further, the RF converter control unit 31 records a temperature detected by the temperature sensor 27 as Tref [° C.] in the temperature storage unit 32. The RF converter 20 transitions to the appropriate input state S103 when the SW 24 and PASW 25 are connected to the path 22, as a trigger.

After the transition to the appropriate input state S103, the RF converter control unit 31 determines whether or not to transition to the excessive input state S102. A determination interval is, for example, every 10 seconds. When transitioning to the excessive input state S102, the RF converter control unit 31 switches SW 24 and PASW 25 to the path 23.

A method of determining the transition to the excessive input state S102 using a temperature fluctuation T is predetermined. For example, the RF converter control unit 31 determines whether or not the RF converter 20 transitions to the excessive input state S102, based on a temperature fluctuation detected by the temperature sensor 27. For example, the RF converter control unit 31 acquires a current temperature Tcur [° C.] from the temperature sensor 27 and obtains the temperature fluctuation T=Tcur−Tref. The RF converter control unit 31 uses the temperature fluctuation T to obtain a fluctuation A of an output level of an analog RF signal at the output end of the RF converter 20. In a case where the fluctuation A becomes equal to or more than a predetermined value, the RF converter control unit 31 determines that the transition to the excessive input state S102 occurs. Here, the predetermined threshold value is, for example, 9 based on Equation (9) to be described below.

The transition to the excessive input state S102 may occur not only due to a temperature inside the RF converter 20, but also due to disconnection between the signal source 10 and the RF converter 20. Therefore, the RF converter control unit 31 detects connection and disconnection of the RF cable 30 by using the cable sensor 28. The detection of connection and disconnection of the cable can be performed, for example, based on the presence or absence of a signal from a port to which the cable is connected.

The cable sensor 28 may further detect connection and disconnection of a control cable (not illustrated) between the signal source 10 and the RF converter 20 and connection and disconnection of a power source cable (not illustrated) of the RF converter 20. In this case, the RF converter control unit performs the same operation as the connection and disconnection of the RF cable 30.

In a case where the transition from the appropriate input state S103 to the excessive input state S102 occurs, the RF converter control unit 31 may notify a user of an alert indicating that the state is the excessive input state. For example, the RF converter control unit 31 displays that the state is the excessive input state and a cause of the state, on the test interface 40. For example, the fact that the state transitions to the excessive input state due to the temperature fluctuation, or that the state transitions to the excessive input state due to the disconnection of the cable is display on the test interface 40.

Hereinafter, the threshold value for transitioning to the excessive input state S102 will be described. When a level at the output end of the RF converter 20 (hereinafter, referred to as an SG output level) is X [dBm] (a root mean square (RMS) value), and an insertion loss from an output end of the PA 21 to the output end of the RF converter 20 (hereinafter, referred to as an insertion loss after the PA) is W [dB], an input level Y [dBm] (a peak value) of the PASW 25 (=an output level at the output end of PA21) is expressed by the following equation. Here, the input level to the RF converter 20 is equivalent to the input level Y [dBm] of the PASW 25.

(Equation 1)

$$Y=X+W+\Gamma+\Delta+\varepsilon \quad (1)$$

Meanwhile, Γ [dB] is a crest factor, for example, Γ=3. Further, Δ [dB] is a fluctuation amount of the SG output level X due to the following, and is expressed by the following equation.

(Equation 2)

$$\Delta=T\cdot\Delta T+\Delta C \quad (2)$$

Here, T [° C.] is a temperature fluctuation after frequency calibration. ΔT is a parameter representing a fluctuation of the output level due to the temperature fluctuation, and is, for example, −0.17 [dB/° C.]. ΔC is a parameter representing a fluctuation of the output level due to the cable, for example, $|\Delta C|>0.5$.

If a temperature detected by the temperature sensor 27 when the frequency calibration is executed is Tref [° C.] and a current temperature detected by the temperature sensor 27 after the frequency calibration is executed is Tcur [° C.], it is expressed as T=Tcur−Tref. In a case where the temperature drops by 5° C., that is, when T=−5, T·ΔT=+0.85. In a case where the temperature rises by 10° C., that is, when T=+10, T·ΔT=−1.7.

When ε [dB] is a fluctuation amount of a digital gain (RMS) of a digital base band signal input to the RF base module 12, and the digital gain (RMS) of the digital base band signal input to the RF base module 12 is g [dB full scale (Fs)] and a reference level of the DAC provided in the RF base module 12 is r [dB Fs], (Equation 3)

$$\varepsilon=g-r \quad (3)$$

is defined.

r is, for example, −16. In this case, Equation (3) is (Equation 4)

$$\varepsilon=g+16 \quad (4)$$

is satisfied. Under a condition of g=r, Equation (4) becomes ε=0. Note that, r=−16 is a case of an analog RF signal corresponding to long term evolution (LTE), and a value of r can be any value corresponding to the analog RF signal.

On the other hand, a maximum input level M [dBm] (a peak value) to the PASW 25 is defined by the following equation.

(Equation 5)

$$M=Y\max \quad (5)$$

(Equation 6)

$$M=X\max+W+\Gamma+\Delta+\varepsilon \quad (6)$$

is satisfied. Here, Xmax is a maximum value of the SG output level X which can be set, for example, Xmax=+5.

When the inventor measures the insertion loss after PA21, it is approximately 10 dB, that is, W=+10. Therefore, in a case of M=+27 and W=+10, (Equation 7)

$$27\le 5+10+\Gamma+\Delta+\varepsilon \quad (7)$$

that is, when (Equation 8)

$$\Gamma+\Delta+\varepsilon\ge 12 \quad (8)$$

is satisfied, the excessive input state S102 to the RF converter 20 is established.

In particular, in a case where the analog signal from the RF base module 12 is input to the RF converter 20 at the reference level (ε=0), Γ=3. for that reason, when (Equation 9)

$$\Delta\ge 9 \quad (9)$$

is satisfied, the excessive input state S102 to the RF converter 20 is established.

Specifically, after executing frequency calibration under a normal temperature environment (23° C.), when the SG output level X is set to +10 dBm so as to execute the frequency calibration under a low temperature environment (5° C.), the PASW 25 fails. Here, the fluctuation A of the SG output level X due to the temperature change is approximately 3 dB based on Equation (2). Further, in a case where a path of the RF converter 20 is set to the path 22, the output level increases by approximately 1 dB due to the influence of reflection. Therefore, under the low temperature environment (when the frequency calibration is not executed), the input level Y [dBm] (a peak value) of the PASW 25 is calculated based on Equation (1).

(Equation 10)

$$\begin{aligned} Y &= X+W+\Gamma+\Delta+\varepsilon \\ &= +10+10+3+(3+1+\alpha)+0 \\ &= +27+\alpha \end{aligned} \quad (10)$$

is determined. Meanwhile, α [dB] is an error due to an individual difference. As a result, it is considered that a signal exceeding the maximum input level is input to the PASW 25.

In at least one of a case where Equation (9) is satisfied in a state in which frequency calibration is not executed, that is,

- in a case where frequency calibration is not performed at low temperature after executing the frequency calibration at high temperature,
- in a case where the signal source 10 and the RF converter 20 are connected by the RF cable 30 having a large loss and frequency calibration is executed, and then the RF cable 30 having the large loss is replaced with the RF cable 30 having a small loss and the frequency calibration is not performed, the excessive input state S102 may occur.

The setting upper limit value Xmax of the SG output level X in the appropriate input state S103 is determined according to the RF converter 20, and is, for example, Xmax=+5 [dBm]. The setting upper limit value Xmax of the SG output level X in the excessive input state S102 is, for example, Xmax=−13 [dBm]. Any value of these Xmax values may be used as long as the excessive input condition to the RF converter 20 can be relaxed to Δ≥27.

In a case where the SG output level X exceeding Xmax is set in the test interface 40, the RF converter control unit 31 may round the SG output level X to Xmax. Further, Xmax=−13 may be set in the test interface 40. In this case, the path 23 is always applied assuming that the state is excessive input state S102, and it is possible to physically guarantee that the PASW 25 does not fail.

According to the first embodiment, in the module which adjusts a level of an analog signal, by providing a path bypassing a power amplifier, it is possible to prevent an output level of the analog signal from exceeding a predetermined upper limit value.

Second Embodiment

Figure 3:
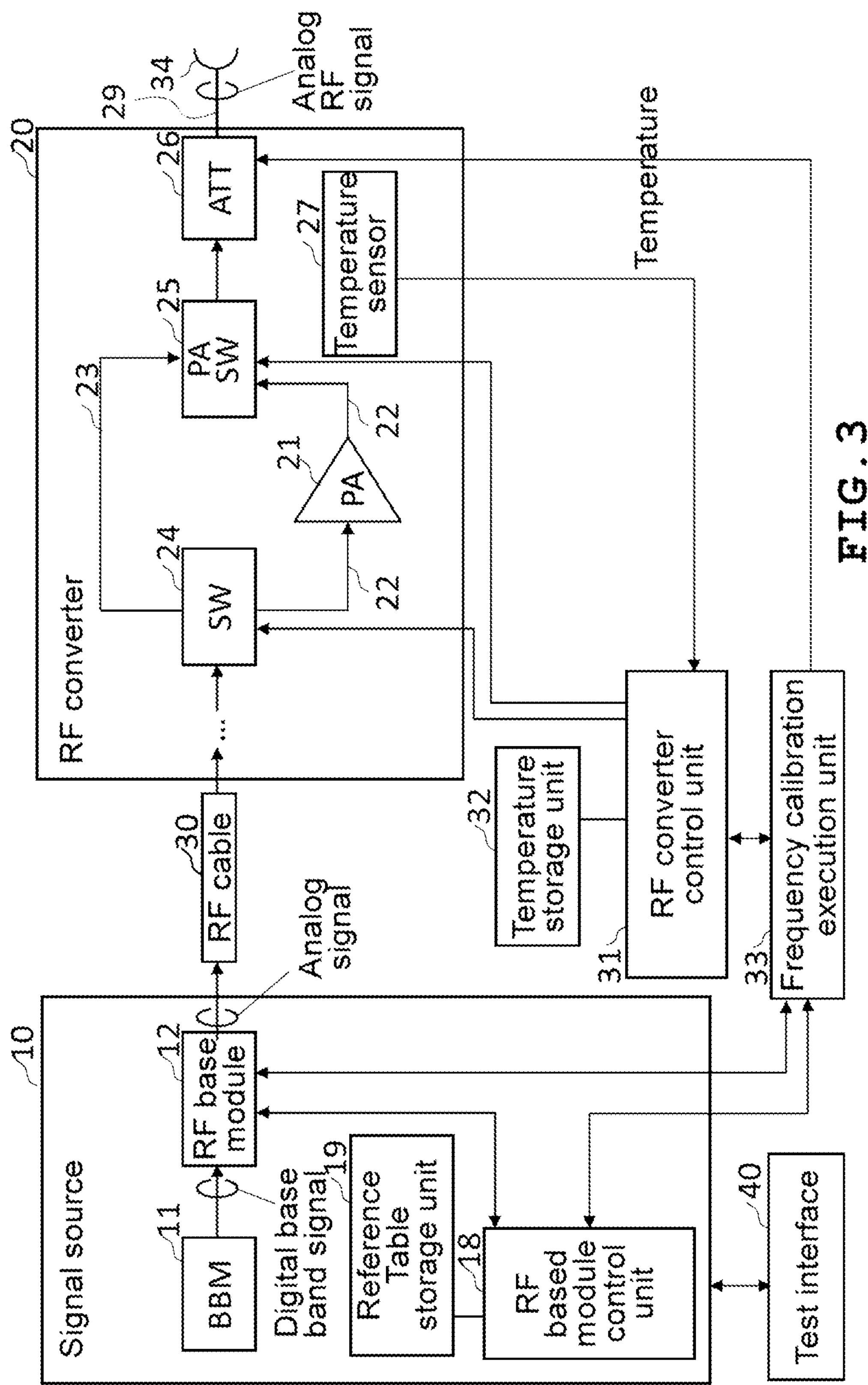
FIG. 3 illustrates an example of a system configuration according to a second embodiment.

FIG. 3 illustrates an example of a system configuration according to a second embodiment. The signal generation apparatus according to the present disclosure includes the signal source 10. In addition to the signal source 10, the signal generation apparatus according to the present disclosure may include the RF converter 20, the frequency calibration execution unit 33, the RF converter control unit 31, and the temperature storage unit 32. The apparatus according to the present disclosure can also be realized by a computer and a program, and the program can be recorded on a recording medium or provided through a network.

The signal source 10 includes the base band module (BBM) 11 which outputs a digital base band signal, the radio frequency (RF) base module 12 which outputs an IF signal, a control module (CTM) 18 which functions as an RF base module control unit which controls the BBM 11 and the RF base module 12, and a reference table storage unit 19 which holds a reference table. The BBM generates a test signal having any pattern. The RF base module 12 includes a digital to analog converter (DA converter) which converts a digital signal into an analog signal, and converts a digital signal from the BBM 11 into an IF signal having an intermediate frequency bandwidth.

The RF converter control unit 31 according to the second embodiment switches between the path 22 and the path 23 of the RF converter 20.

In Equation (3), in a case of r=−10, Equation (3) is (Equation 11)

$$\varepsilon=g+10 \quad (11)$$

is satisfied. Under a condition of g=r, Equation (4) becomes ε=0.

When Equation (8) is established as in the first embodiment, the PASW 25 is in an excessive input state in which an excessive load is applied.

Therefore, the present disclosure prevents the excessive input state by adjusting a parameter of "Γ" included in Equation (8) so that the value is equal to or less than an input limit value of the RF converter 20.

In the present embodiment, the signal source 10 has a reference table for setting a clipping amount, and the RF base module 12 clips the IF signal based on the reference table. The clipping amount is determined according to the SG output level X [dBm] and an upper limit value of the crest factor Γ. In a case where a margin of the crest factor of the RF base module 12 is predetermined to 16 dB, the upper limit value of the crest factor Γ is limited to a permission range equal to or less than 16 dB.

FIG. 4 illustrates an example of the reference table in a case where an IF signal is clipped step by step in 1 dB steps when the margin of the crest factor of the RF base module 12 is predetermined to 16 dB and, for example, Δ=2 [dB] and ε=0 [dB].

The clipping process is performed according to the following steps 1 to 3.

Step 1

A level of an analog RF signal to be output from the test interface 40, that is, the SG output level is set.

Step 2

The RF base module control unit (CTM) 18 calculates the level of the analog RF signal set in step 1 according to the reference table, and a threshold value of the clipping power according to the presence or absence of the corresponding clipping, and the clipping amount when the clipping is present. The presence or absence of the clipping and the threshold value of the clipping power are set in the RF base module 12. After this setting, generation of the analog signal by the signal source 10 is started.

Step 3

After the start of generation of the analog signal at the signal source 10, the RF base module 12 performs clipping in a case where power of the digital base band signal input to the RF base module 12 exceeds the threshold value.

When the SG output level is set (step 1), the RF base module control unit (CTM) 18 calculates the clipping amount from the SG output level according to the reference table (step 2). At the same time, the CTM 18 calculates the threshold value of the clipping power by using the calculated clipping amount. In a case where the clipping process is required, the CTM 18 writes the calculated clipping amount and the calculated threshold value of the clipping power to the RF base module 12.

Here, the threshold value for the clipping power is expressed as the following equation.

(Equation 12)

$$P_{Clip}=P_{FullScale}\cdot 10^{-P_{Clip\_dB}/10} \tag{12}$$

In step 3, in a case where the power of the digital base band signal to be transmitted is (Equation 13)

$$I^2+Q^2>P_{Clip} \tag{13}$$

, the clipping process is executed.

Meanwhile, in the actual clipping process, on an amplitude of each of I and Q for simplification, (Equation 14)

$$\sqrt{\frac{P_{Clip}}{2}} \tag{14}$$

the clipping process is performed as follows. Here, PClip_dB [dB] corresponds to a clipping amount [dB] of the reference table.

Also, $P_{FullScale}$ is a digital gain of a digital base band signal at a full scale (RMS), and (Equation 15)

$$P_{FullScale}=(I_{FullSale})^2+(Q_{FullSale})^2 \tag{15}$$

is satisfied.

The RF base module control unit (CTM) 18 holds a state of the presence or absence of the clipping process at startup with an initial value of "no clipping process" for each type of the analog RF signal.

When receiving information on the SG output level X from the test interface 40, the RF base module control unit (CTM) 18 calculates a clipping amount from the SG output level and writes the clipping amount to the RF base module 12. Therefore, the IF signal output from the RF base module 12 is clipped by the RF base module 12 based on the SG output level X.

In a case where a transition from "no clipping process" to "with clipping process" occurs, the RF base module control unit (CTM) 18 executes the above steps 1 and 2 and notifies the test interface 40 of a message to that effect. When receiving this notification, the test interface 40 displays that the clipping process is performed.

In a case where a transition from the occurrence of the clipping process to no clipping process occurs, the RF base module control unit (CTM) 18 notifies the test interface 40 of a message to that effect. When receiving this notification, the test interface 40 displays that the clipping process is released.

It is optional to display that the clipping process is performed and that the clipping process is released. For example, in a case where the clipping process is performed, the test interface 40 notifies the user of a message of "[WARNING] Output signal might be clipped with the set output level. Please adjust output level.". For example, in a case where the clipping process is released, the test interface 40 notifies the user of the message of "Signal clipping has been released.".

According to the second embodiment, in the module which adjusts a level of an analog signal, it is possible to prevent an excessive input to an RF converter by adjusting the output level while a margin of a crest factor is defined.

Third Embodiment

Figure 5:
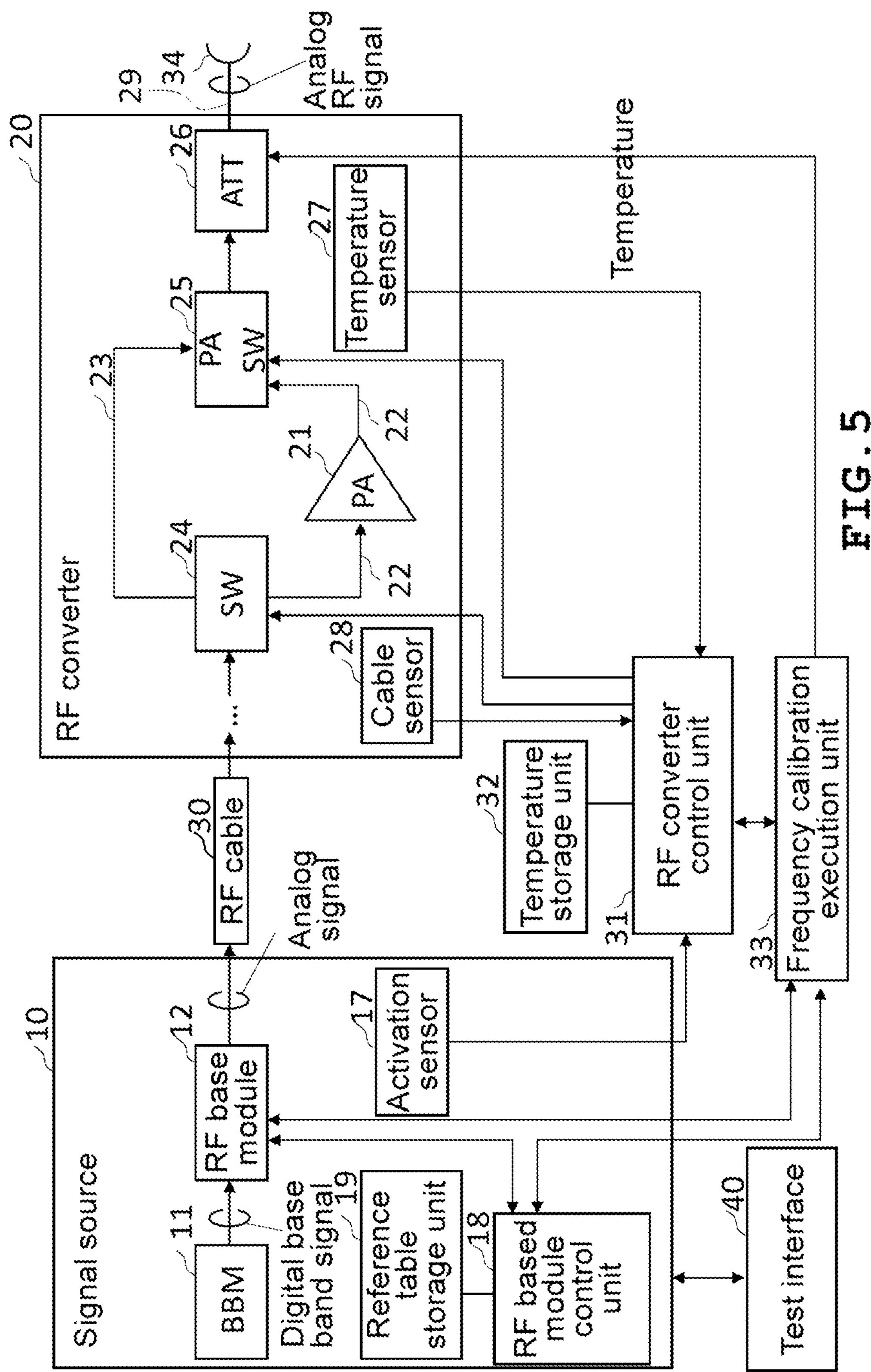
FIG. 5 illustrates an example of a system configuration according to a third embodiment.

FIG. 5 illustrates an example of a system configuration according to a third embodiment. The signal source 10 according to the present embodiment includes the activation sensor 17 which detects ON and OFF of a power supply of the signal source 10. The RF converter 20 according to the present embodiment includes the cable sensor 28 which detects connection or disconnection of the RF cable 30.

Immediately after the signal source 10 is activated, the state transitions to the excessive input state S102, and in the excessive input state S102, the path 22 is not connected.

When the user performs an operation of frequency calibration with the test interface 40, the frequency calibration execution unit 33 executes the frequency calibration. When the frequency calibration execution unit 33 completes the execution of the frequency calibration, the frequency calibration execution unit 33 notifies the RF converter control unit 31 that the execution of the frequency calibration is completed, and the RF converter 20 transitions to the appropriate input state S103. The RF converter control unit 31 can connect the SW 24 and the PASW 25 to the path 22, by the SG output level. Further, the RF converter control unit 31 records a temperature detected by the temperature sensor 27 as Tref [° C.] in the temperature storage unit 32.

In a case where an analog signal from the RF base module 12 is a continuous wave (CW) and is input to the RF converter 20 at the reference level (ε=0), Γ=3.

When Equation (9) is satisfied, the RF converter 20 is in the excessive input state S102.

According to the third embodiment, in the module which adjusts a level of an analog signal, it is possible to prevent an excessive input to an RF converter by adjusting the output level while a margin of a crest factor is defined and providing a path bypassing a power amplifier.

The control unit refers to the RF base module control unit 18 and the RF converter control unit 31, and may have only one function or both functions.

INDUSTRIAL APPLICABILITY

The present disclosure can be applied to information communication industry.

DESCRIPTION OF REFERENCE NUMERALS AND SIGNS

10: Signal source
11: BBM
12: RF base module
17: Activation sensor
18: CTM (RF base module control unit)
20: RF converter
21: PA
22, 23: Path
24: SW
25: PASW
26: ATT
27: Temperature sensor
28: Cable sensor
29: Output terminal
30: RF cable
31: RF converter control unit
32: Temperature storage unit
33: Frequency calibration execution unit
34: Antenna
40: Test interface

What is claimed is:

1. A signal generation apparatus comprising:
- a radio frequency (RF) converter configured to convert an analog signal for testing into an analog RF signal, the RF converter comprising:
  - a power amplifier configured to amplify the analog signal for testing, and
  - a switch configured to selectively switch between a first path and a second path, the first path passing through the power amplifier and the second path bypassing the power amplifier;
- at least one controller configured to adjust an amplitude of a frequency included in the analog RF signal; and
- a temperature sensor configured to measure a temperature inside the RF converter,
- wherein the at least one controller is further configured to:
  - control an input level of the analog signal for testing such that the input level does not exceed a predetermined upper limit value;
  - connect the switch to the first path, completion of the adjustment of the amplitude being a trigger for connecting the switch, and
  - switch the switch from the first path to the second path based on a temperature fluctuation detected by the temperature sensor.

2. The signal generation apparatus according to claim 1, wherein the RF converter:
- is connected to a signal source configured to generate the analog signal for testing by using an RF cable, and
- further comprises a cable sensor configured to detect disconnection of the RF cable, and
- wherein when the cable sensor detects the disconnection of the RF cable, the at least one controller is configured to switch the switch from the first path to the second path.

3. The signal generation apparatus according to claim 2, further comprising:
- an activation sensor configured to detect activation of the signal source,
- wherein when the activation sensor detects the activation of the signal source, the at least one controller is configured to connect the switch to the second path.

4. A signal generation apparatus comprising:
- a radio frequency (RF) converter configured to convert an analog signal for testing into an analog RF signal;
- at least one controller configured to control an output level of the analog signal such that the output level does not exceed a predetermined upper limit value;
- an RF base module configured to convert a digital base band signal for testing into an intermediate frequency (IF) signal and to output the IF signal to the RF converter as the analog signal for testing; and
- a reference table that associates a clipping amount with the output level of the analog RF signal,
- wherein the RF converter is configured to convert the analog signal for testing into the analog RF signal by frequency-converting the IF signal, and
- wherein the at least one controller is further configured to clip the IF signal output from the RF base module based on the output level of the analog RF signal output from the RF converter such that:
  - when the output level of the analog RF signal is set, the at least one controller is further configured to calculate a threshold value of clipping power based on the reference table, and
  - when a power of the digital base band signal exceeds the threshold value, the RF base module is configured to clip the IF signal according to the clipping amount in the reference table.

5. The signal generation apparatus according to claim 4, further comprising:
- a base band module configured to generate the digital base band signal and to output the digital base band signal to the RF base module.

6. The signal generation apparatus according to claim 4, wherein the RF converter includes a power amplifier, and a switch that switches between a path passing through the power amplifier and a path bypassing the power amplifier.

7. The signal generation apparatus according to claim 5, wherein the RF converter includes a power amplifier, and a switch that switches between a path passing through the power amplifier and a path bypassing the power amplifier.

8. A signal generation method using a signal generation apparatus comprising a radio frequency (RF) converter configured to convert an analog signal for testing into an analog RF signal, wherein the RF converter comprises: a power amplifier configured to amplify the analog signal, and a switch that-configured to selectively switch between a first path and a second path, the first path passing through the power amplifier and the second path bypassing the power amplifier, the method comprising:

controlling an output level of the analog signal such that the output level does not exceed a predetermined upper limit value; and switching the switch from the first path to the second path based on temperature fluctuations in the RF converter, disconnection of an RF cable that inputs the analog signal for testing to the RF converter, or activation of a signal source that generates the analog signal for testing.

9. The signal generation method according to claim 8, wherein the signal generation apparatus further comprises:

an RF base module that is configured to convert a digital base band signal for testing into an intermediate frequency (IF) signal and to output the IF signal as the analog signal for testing, and a controller, and wherein the method further comprises clipping the IF signal based on an output level of the analog RF signal output from the RF converter.

* * * * *